United States Patent [19]
Rempfer

[11] Patent Number: 5,396,245
[45] Date of Patent: Mar. 7, 1995

[54] DIGITAL TO ANALOG CONVERTER

[75] Inventor: William C. Rempfer, San Jose, Calif.

[73] Assignee: Linear Technology Corporation, Milpitas, Calif.

[21] Appl. No.: 7,108

[22] Filed: Jan. 21, 1993

[51] Int. Cl.⁶ ............................................ H03M 1/68
[52] U.S. Cl. .................................. 341/145; 341/121
[58] Field of Search ............... 341/121, 144, 145, 146, 341/118, 136

[56] References Cited

U.S. PATENT DOCUMENTS

| | | | |
|---|---|---|---|
| 4,866,261 | 9/1989 | Pace | 341/138 |
| 4,873,525 | 10/1989 | Iida | 341/145 |
| 4,918,448 | 4/1990 | Hauviller et al. | 341/145 |
| 4,973,979 | 11/1990 | Ikeda | 341/154 |
| 4,978,959 | 12/1990 | Chong et al. | 341/101 |
| 5,212,482 | 5/1993 | Okuyama | 341/139 |

OTHER PUBLICATIONS

Data Sheet, "ADC0820 8-Bit High Speed μ PCompatible A/D Converter with Track/Hold Function," National Semiconductor Corporation 1988 Linear Databook, pp. 5-77 to 5-92, 1988.

Peter Holloway, "Data AcquisitionCircuits," 1984 *IEEE International Solid–State Circuits Conference*, pp. 66–67, Feb. 22, 1984.

John A. Schoeff, "Data Acquisition II," 1979 *IEEE International Solid–State Circuits Conference*, pp. 178–179 and pp. 292–293, Feb. 15, 1979.

Primary Examiner—Marc S. Hoff
Attorney, Agent, or Firm—Fish & Neave

[57] ABSTRACT

A segmented DAC is described in which the outputs of a pair of subword DAC circuits are summed by modulating the offset voltage of a differential buffer amplifier. Also described are various alternative DAC embodiments and an operational amplifier input stage in which modulation of the offset voltage of a differential amplifier responsive to a digital signal is accomplished using interpolation techniques for eliminating errors in linearity and monotonicity arising from component inaccuracies.

56 Claims, 6 Drawing Sheets

DIGITAL TO ANALOG CONVERTER

BACKGROUND OF THE INVENTION

This invention is concerned with digital to analog converters. More particularly, it is concerned in one aspect with improving the architecture of segmented digital to analog converters and in another aspect with providing digital to analog converters having an analog output voltage which is a monotonic function of a digital input word.

A digital to analog converter (DAC) having a segmented structure typically operates by dividing a digital input word into subwords which control different parts of the DAC circuit. For example, a digital input word might be divided into a more significant (MS) subword and a less significant (LS) subword, the MS subword being used to generate a first intermediate current or voltage signal that is summed with a second intermediate current or voltage signal generated responsive to the LS subword. Such segmented structures are particularly useful for reducing the number of resistive elements required to provide a DAC with high resolution (e.g., 12 bits). However, summing the intermediate signals without buffering the outputs of the signal generating circuits may subject the outputs of the signal generating circuits to excessive load conditions. On the other hand, adding such buffering to the output of each signal generating circuit typically introduces noise and adds to the cost and complexity of the DAC.

Another potential problem which can be exacerbated by providing a buffer at the output of each signal generating circuit is non-monotonicity in the transfer characteristics of the DAC. In an ideal digital to analog converter (DAC), the analog output voltage should be a monotonic function of the digital input; that is, an increase in the digital input should lead to an increase in the analog output voltage, and a decrease in the digital input should lead to a decrease in the analog output voltage. Monotonicity is vital in many applications such as in control systems where non-monotonic DACs can create serious problems. In many practical cases, however, due to unavoidable component inaccuracies in the DACs, monotonicity is not always obtained.

Consider, for example, a typical 4-bit DAC which uses simple binary weighting to generate an analog output voltage by adding together binary multiples of 0.5, 0.25, 0.125, and 0.0625 volts. It is well known that, with this choice of weights, an increase in the digital input will always lead to an increase in the analog output.

For example, in such a DAC, a digital input string of 0111 would generate an analog output voltage of $0(0.5)+1(0.25)+1(0.125)+1(0.0625)=0.4375$ volts. If the digital input is incremented to 1000, the analog output voltage increases to $1(0.5)+0(0.25)+0(0.125)+0(0.0625)=0.5$ volts. Thus, as expected, an increment in the digital input results in an increase in the analog output.

However, if the binary weights are inaccurate, due for example to resistive element inaccuracies, this monotonic relationship between input and output may be lost. Suppose that the weights are actually 0.47, 0.27, 0.14, and 0.07 volts instead of their ideal values given above. In this case, the analog output voltage corresponding to a digital input of 0111 is $0(0.47)+0(0.27)+1(0.14)+1(0.07)=0.48$ volts. When the digital input is incremented to 1000, the analog output voltage actually decreases to $1(0.47)+0(0.27)+0(0.14)+0(0.07)=0.47$ volts. Thus, the analog output voltage in this case is not a monotonic function of the digital input.

The errors described above which lead to non-monotonic input/output relationships are particularly prevalent in DACs which sum together many binary weighted voltages, i.e., DACs having many bits. Yet it is precisely these devices that are required to provide accurate, monotonic digital to analog conversion.

In view of the foregoing, it would be desirable to provide a segmented DAC which is simple to implement and which provides immunity to loading problems associated with unbuffered analog summing of intermediate signals.

It would further be desirable to provide a segmented DAC which does not require a separate buffer circuit between the output of each signal generating circuit and the summing circuitry of the DAC.

It would also be desirable to provide a circuit for converting a digital input word into an analog output voltage in such a way that the analog output voltage is a monotonic function of the digital input word.

SUMMARY OF THE INVENTION

It is an object of the present invention to provide a segmented DAC having a simple architecture and a novel summing technique immune to loading problems.

It is another object of the present invention to provide a DAC in which problems in maintaining monotonicity arising from component inaccuracies are avoided.

In accordance with these and other objects of the present invention, a segmented DAC is described in which the outputs of a pair of subword DAC circuits are summed by modulating the offset voltage of a differential amplifier, which may be a unity-gain buffer amplifier or an amplifier having a different gain. Also described are various alternative DAC embodiments and an operational amplifier input stage in which modulation of the offset voltage of a differential amplifier responsive to a digital signal is accomplished using interpolation techniques for eliminating errors in linearity and monotonicity arising from component inaccuracies.

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
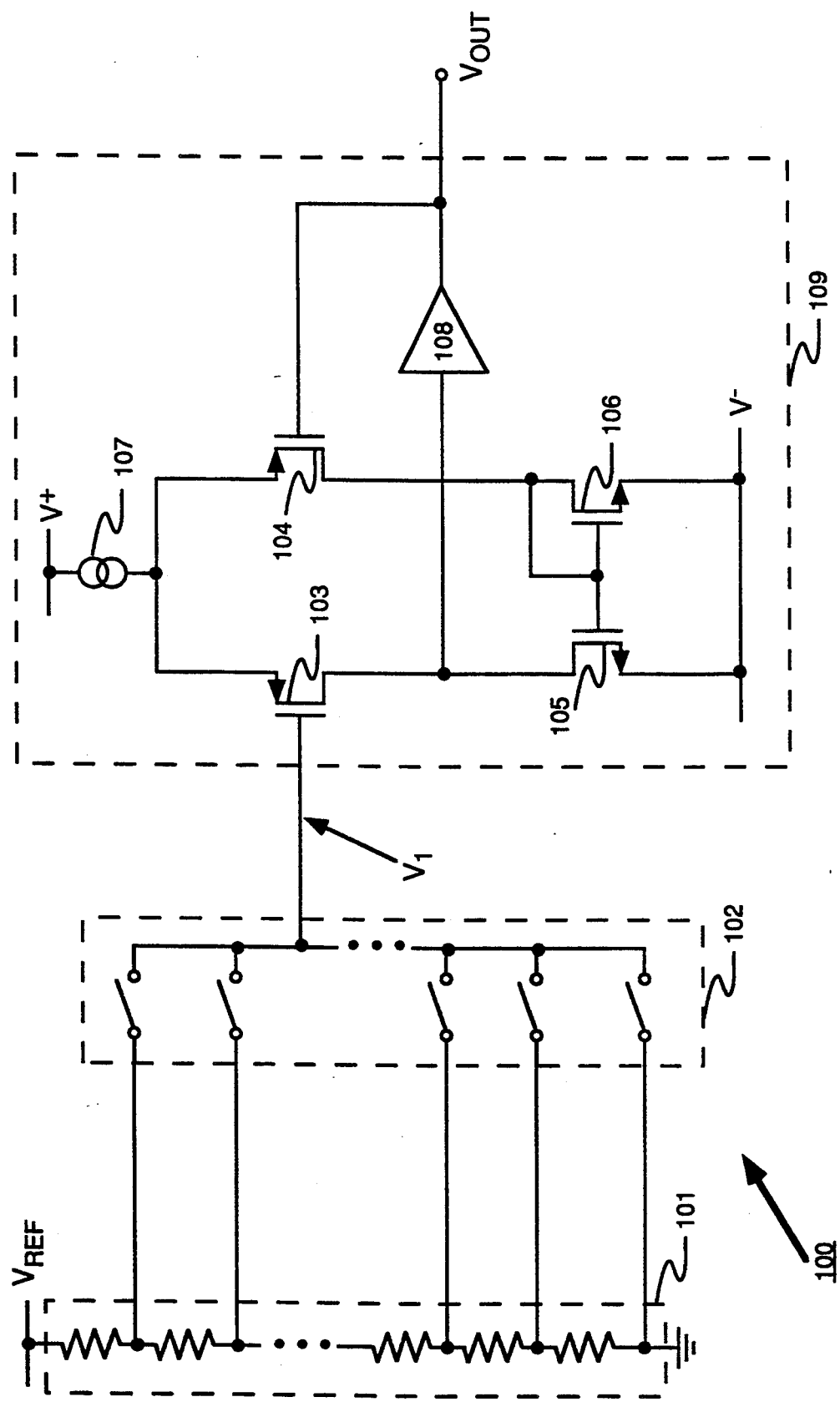
FIG. 1 is a block schematic diagram of a conventional monotonic DAC.

A typical example of a conventional N-bit DAC which provides guaranteed monotonic conversion is shown in simplified schematic form in FIG. 1. DAC 100 comprises ladder 101 of $2^N$ resistive elements with the junctions of the resistive elements coupled by bank 102 of $2^N$ switching devices to the input of unity gain buffer 109 comprising components 103 through 108. Although one particular embodiment of buffer 109 is shown, any conventional buffer could be used. Buffer 109 includes current source 107 which feeds the sources of PMOS transistors 103 and 104. The drains of transistors 103 and 104 are coupled to the drains of NMOS transistors 105 and 106. Transistors 105 and 106 form a current mirror. High-gain, inverting amplifier 108 provides negative feedback from the drain of transistor 103 to the gate of transistor 104. This feedback ensures that the drain currents of transistors 105 and 106 are substantially equal. This, in turn, ensures that the gate voltages of transistors 103 and 104 are substantially equal. Thus, the output voltage $V_{OUT}$ is substantially equal to $V_1$, the output of switching device bank 102.

Switching device bank 102 and resistive element ladder 101 are designed to provide an analog output voltage which is determined by a digital input word. In FIG. 1, ladder 101 and bank 102 are represented as conventional resistive elements and switching devices. However, they can be implemented in any convenient manner. For example, the resistive element ladder could be implemented with a variety of resistive materials available in an integrated circuit, and the switching devices could be MOS switches or transmission gates. Only one switching device in bank 102 is closed at any one time, and the particular switching device that is closed is determined by the digital input. Specifically, the number of resistive elements between the ground node and the node connected to the buffer amplifier's input is equal to the decimal equivalent k of the digital input. For example, with N=4, and a digital input of 0000 (k=0), the switching device nearest to ground in the ladder is closed; with a digital input of 0001 (k=1), the next switching device in the ladder is closed; and so on until, with an input of 1111 (k=15), the top-most switching device in the ladder is closed. To determine which switching device is closed requires decoding of the digital input word, and can this be accomplished in any conventional way. The precise way of implementing ladder 101, bank 102, and the necessary decoding do not form part of this invention.

The voltage at the junction of any two resistive elements in ladder 101 is a monotonic function of the number of resistive elements between that particular junction and the ground node, and, as described above, this number of resistive elements is the decimal equivalent k of the digital input. Thus, the analog voltage at the buffer amplifier's input is a monotonic function of digital input. This monotonicity is guaranteed regardless of the actual values of the individual resistive elements. However, if all of the resistive elements have equal values, then the analog output voltage will be a linear function of the digital input given by $V_{OUT}=k\ VEF_{RE}/2^N$.

In spite of its guaranteed monotonic behavior, the DAC of FIG. 1 is not a preferred embodiment when the number of bits N becomes high because, in this embodiment, the DAC requires too many switching devices and resistive elements. Several attempts have been made to overcome the disadvantage of using so many switching devices and resistive elements, but these attempts have resulted in DACs which are no longer guaranteed to be monotonic, or have been cumbersome and costly.

Figure 2:
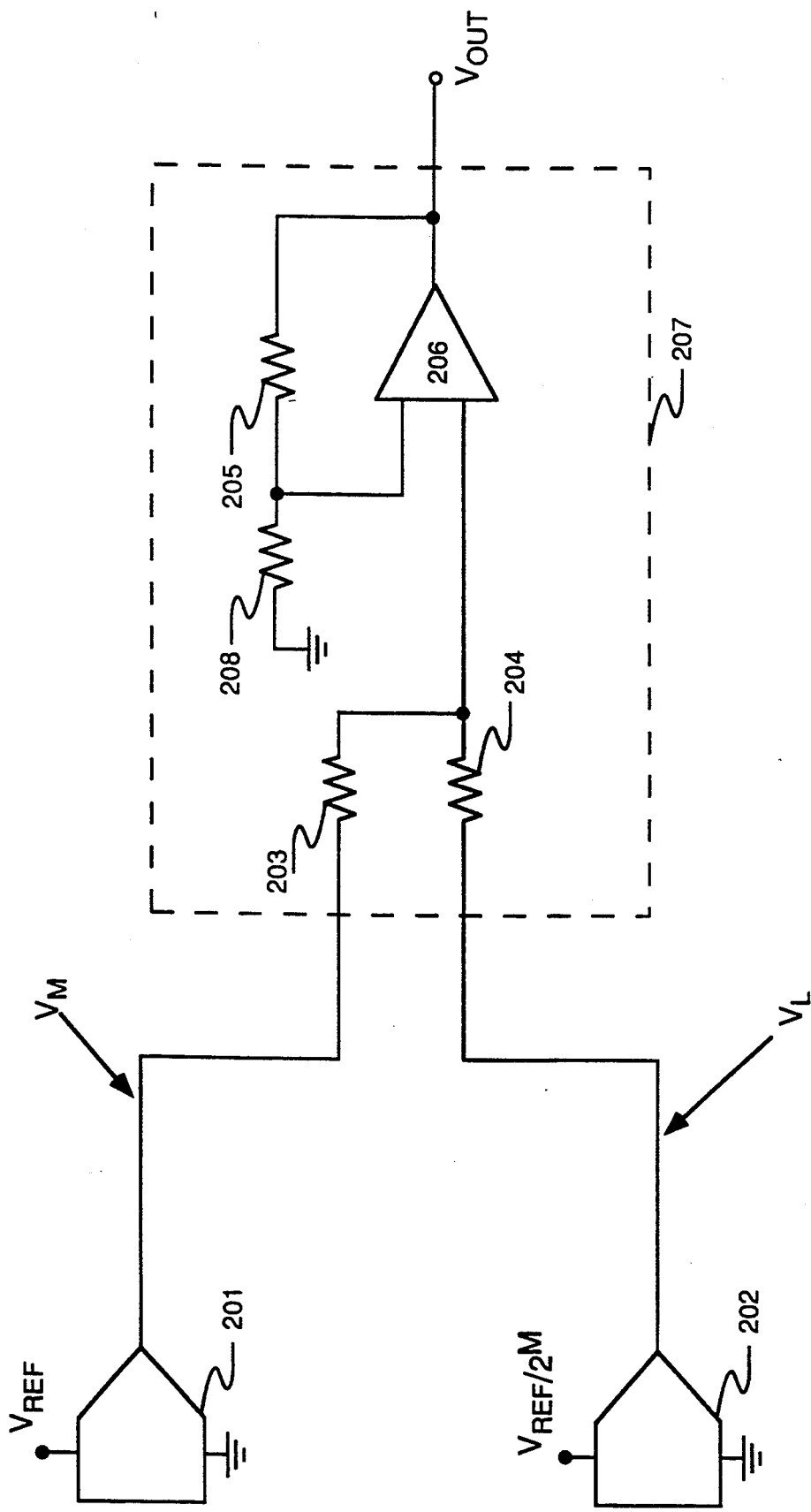
FIG. 2 is a block schematic diagram of a conventional segmented DAC.

FIG. 2 shows a schematic diagram of a typical conventional circuit using segmentation to reduce the number of switching devices and resistive elements in a DAC. In this circuit, the N-bit digital input word is segmented into two subwords. One subword, the most significant (MS) subword, corresponds to the M most significant bits, and the other subword, the least significant (LS) subword, corresponds to the L least significant bits, where M+L=N. The decimal equivalents of the LS and MS subwords are denoted by $k_L$ and $k_M$ respectively, and are related to the decimal equivalent of the digital input word by $$k=2^L k_M + k_L. \tag{1}$$

The MS subword is coupled to most significant DAC (MSDAC) 201. MSDAC 201 is fed by reference voltage $V_{REF}$, and its output is given by $V_M = k_M V_{REF}/2^M$. The LS subword is coupled to least significant DAC (LSDAC) 202. LSDAC 202 is fed by reference voltage $V_{REF}/2^M$. This reference voltage is chosen so that the full-scale output of LSDAC 202 is equal to the change in $V_M$ when the input to MSDAC 201 is incremented by one bit. The output of LSDAC 202 is therefore $V_L = k_L V_{REF}/(2^M 2^L) = k_L V_{REF}/2^N$ where $k_L$ is the decimal equivalent of the LS subword.

The output of MSDAC 201 and LSDAC 202 are added together by analog adder 207 to produce output voltage $V_{OUT}$. Analog adder 207 includes resistive elements 203, 204, 205, and 208, and amplifier 206. If resistive elements 203, 204, 205, and 208 are substantially equal, then analog adder 207 has a gain of unity. With unity gain, $V_{OUT}$ is given by $$\begin{aligned} V_{OUT} &= k_M V_{REF}/2^M + k_L V_{REF}/2^N \\ &= (2^L k_M + k_L) V_{REF}/2^N \\ &= k V_{REF}/2^N. \end{aligned}$$

Thus, the output voltage is controlled by the digital input word k, and can vary over the entire range of zero to $V_{REF}$ in $2^N$ steps.

Compared to the guaranteed monotonic DAC of FIG. 1, the segmented DAC of FIG. 2 reduces the number of resistive elements and switching devices required. Assuming that MSDAC 201 and LSDAC 202 individually have the structure of the DAC in FIG. 1, then the total number of resistive elements required is $2^M + 2^L$ which can be considerably less than the $2^N$ resistive elements required by the DAC of FIG. 1. The number of switching devices required is also reduced by the same amount.

However, the segmented DAC of FIG. 2 has drawbacks. For example, if resistors 203 and 204 were to be connected directly to respective switch banks, they would load the associated resistive element ladders and disturb the linearity of the DAC. This requires that a buffer, such as buffer 109 of FIG. 1, be included in each of MSDAC 201 and LSDAC 202. Such buffers introduce noise, have their own voltage offset and drift which must be compensated, and add complexity to the DAC.

Further, although segmenting allows the number of resistive elements and switching devices to be reduced substantially, it does not guarantee monotonicity. Just as in the binary weighted DAC described earlier, the analog output voltage of a segmented DAC is obtained by adding together multiple analog voltages. The full-scale output of LSDAC 202 must equal each change in the output of MSDAC 201 as the MS subword is incremented. If this equality is not achieved, and specifically if the full-scale output of LSDAC 202 is greater than at least one increment of MSDAC 201, then non-monotonic behavior will occur.

The present invention shows a new approach to digital to analog conversion which reduces the number of switching devices and resistive elements, and simplifies the architecture of the DAC of FIG. 2. Additional embodiments further guarantee monotonicity. In the preferred embodiment of the invention shown in FIG. 5 and discussed below, interpolation is used to provide a DAC which uses both a small number of resistive elements and switching devices, and is simultaneously guaranteed to be monotonic.

Figure 3:
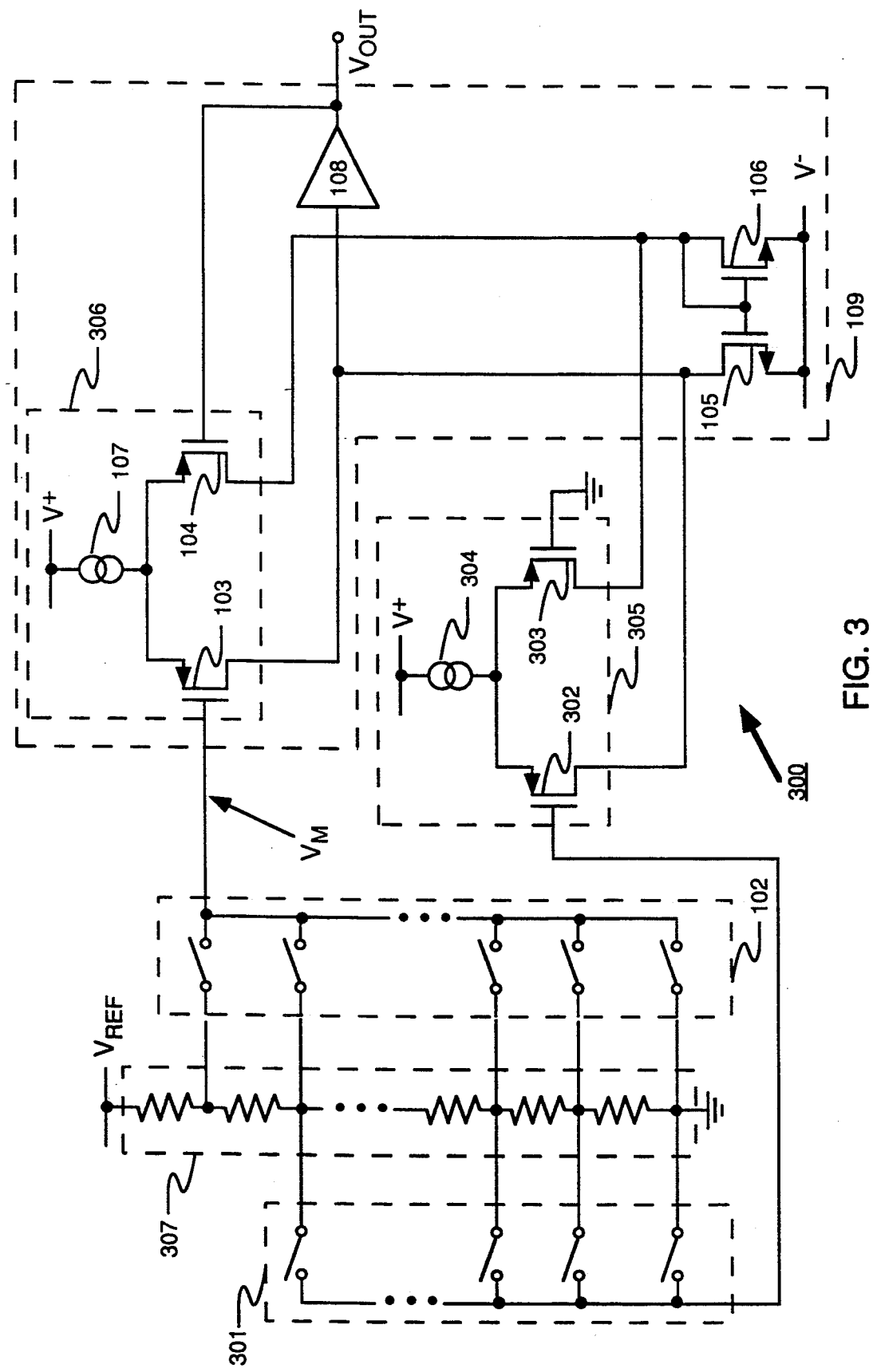
FIG. 3 is a block schematic diagram of an embodiment a segmented DAC in which intermediate signals are summed by modulating the offset voltage of a differential amplifier in accordance with principles of the present invention.

FIG. 3, showing segmented DAC 300, illustrates the way in which the present invention simplifies the architecture of DAC 200. As in segmented DAC 200, DAC 300 uses two subwords. However, only one serial connection of resistive elements is used, and the total number of resistive elements required is $2^P$, where P is the larger of L and M. For the purposes of this description, P will be assumed to be equal to M, but this assumption is not necessary.

DAC 300 is obtained from DAC 100 by reducing the length of resistive element ladder 101 from $2^N$ resistive elements to $2^M$ resistive elements, and by introducing switching device bank 301, transistors 302 and 303, and current source 304. The MS subword controls switching device bank 102, and the LS subword controls switching device bank 301.

The output of the LS switching device bank 301 is coupled to the input of least significant differential transconductance stage (LSDTS) 305 comprising current source 304 and transistors 302 and 303. The second input of differential transconductance stage 305 is grounded.

The output of MS switching device bank 102 is coupled to the input of most significant differential transconductance stage (MSDTS) 306 comprising current source 107 and transistors 103 and 104. The drains of transistors 103 and 104 form respectively first and second differential current outputs of transconductance stage 306. The difference between the currents flowing from the drains of transistors 103 and 104 together comprise a differential current generated by transconductance stage 306. The second input of differential transconductance stage 306 is coupled to the output $V_{OUT}$. This negative feedback path ensures that the currents flowing into the drains of transistors 105 and 106 are substantially equal.

To understand the operation of the circuit, consider first its behavior with switching device bank 301, transistors 302 and 303, and current source 304 removed. The output is therefore only affected by the MS subword $k_M$ which controls switching device bank 102. In this case, DAC 300 has exactly the same form as DAC 100. Thus, the MS part of the DAC behaves monotonically, with its output voltage given by $$V_{OUT}=k_M V_{REF}/2^M. \quad (2)$$

NOW re-introduce switching device bank 301, transistors 302 and 303, and current source 304. If equal currents flow out of the drains of transistors 302 and 303 (the drains of the transistors 302 and 303 forming respectively the first and second differential current outputs of transconductance stage 305, and the difference between the currents flowing from these drains together comprising a differential current generated by transconductance stage 305), then, due to the action of the current mirror made up of transistors 105 and 106, the output $V_{OUT}$ is substantially unaffected by the presence of components 301 through 304. This equal current will flow when the gates of transistors 302 and 303 are at equal voltages, and because the gate of transistor 303 is grounded, this will occur when $k_L=0$ and switching device 301a is closed.

If $k_L$ is not zero, the voltage supplied by switching device bank 301 to the gate of transistor 302 is $$V_L = k_L V_{REF}/2^M.$$

This results in a differential current from LSDTS 305 of $$dI = k_L V_{REF} g_{mL}/2^M \quad (3)$$

where $g_{mL}$ is the transconductance of LSDTS 305.

Recall that negative feedback causes the output voltage to change in order to force the two currents flowing in the current mirror to be substantially equal. Thus, the output voltage must change by an amount dV which creates a differential current from MSDTS 306 which is equal but opposite to the differential current of LSDTS 305. Thus, the differential current of MSDTS 306 is $$dI = g_{mM} dV \quad (4)$$

where $g_{mM}$ is the transconductance of MSDTS 306. The change dV can be interpreted as a scaled offset voltage $V_{OS}$ created in buffer 109 by the addition of a differential current from LSDTS 305, and this differential current is determined by the LS subword.

Substituting equation (3) into equation (4) and solving for the change in output voltage gives $$dV = (g_{mL}/g_{mM}) k_L V_{REF}/2^M.$$

This change is added to the already present output voltage determined by the MS subword as given in equation (2). The resulting output voltage is then $$V_{OUT} = k_M V_{REF}/2^M + (g_{mL}/g_{mM}) k_L V_{REF}/2^M. \quad (5)$$

The transconductance ratio $g_{mL}/g_{mM}$ in the equation above is a parameter which is controlled by the geometry of transistors 103, 104, 302, and 303, and by current sources 107 and 304. A convenient transconductance ratio is obtained when transistors 103 and 104 have width to length ratios which are $2^L$ times greater than the width to length ratios of transistors 302 and 303, and current source 107 produces $2^L$ times as much current as current source 304. In this case, transistors 103 and 104 have transconductances which are $2^L$ times higher those of transistors 302 and 303, or $$g_{mL}/g_{mM} = 2^{-L}$$

and the output voltage is given by $$\begin{aligned} V_{OUT} &= (k_M + 2^{-L}k_L)V_{REF}/2^M \\ &= (2^L k_M + k_L)V_{REF}/2^{M+L} \\ &= kV_{REF}/2^N. \end{aligned}$$

Thus, by choosing the transconductance ratio appropriately, the output voltage of DAC 300 can be made proportional to the decimal equivalent of the digital input word k. The LS subword controls the amount of voltage added to the output voltage determined by the MS subword. If the transconductance ratio is chosen properly and if the resistive elements in ladder 307 are accurately matched, the additional voltage contributed by the LS subword modifies the output voltage such that it lies between $k_M V_{REF}/2^M$ and $(k_M+1) V_{REF}/2^M$.

DAC 300 requires only a small number of resistive elements and switching devices. However, it still has some limitations. In particular, DAC 300 does not truly interpolate voltages between two adjacent junctions (or taps) in resistive element ladder 307; i.e., the range of LSDTS 305 is not defined absolutely by the two adjacent taps on ladder 307, but by taps at the bottom of ladder 307. In addition, the range of LSDTS 305 is affected by the ratio $g_{mL}/g_{mM}$. Therefore, the monotonicity of DAC 300 depends on accurate control of voltage increments from resistive element junction to resistive element junction in ladder 307, and depends on accurate control of the transconductances of transistors 103, 104, 302, and 303.

Still more specifically, if all resistive elements in ladder 307 are not substantially equal, the voltage increments from resistive element junction to resistive element junction will not be uniform (so called ladder tap errors occur). If, as is usually the case, M is greater than L, LSDTS 305 always obtains its input from the $2^L$ resistive elements nearest ground in ladder 307, while MSDTS 306 obtains its input over the entire extent of ladder 307. This is a disadvantage because, for monotonicity, DAC 300 relies on the fact that the voltage across these $2^L$ resistive elements nearest to ground is equal to $2^L$ times the voltage across any individual resistive element in ladder 307. This is analogous to the requirement in DAC 200 that the full-scale output of the LSDAC should equal the output increments of the MSDAC. If the voltage increments from tap to tap are not uniform, this requirement is not satisfied in DAC 300 and non-monotonic behavior may occur.

Monotonic operation of DAC 300 also requires the transconductance ratio $g_{mL}/g_{mM}$ to be accurately maintained at $2^L$. However, the transconductances are influenced by the common mode voltage at which LSDTS 305 and MSDTS 306 operate. Because LSDTS 305 always obtains its input from the $2^L$ resistive elements nearest to ground in ladder 307, while MSDTS 306 obtains its input over the entire extent of ladder 307, these common mode voltages are not always equal, and often not even similar. Thus, the transconductance ratio may vary, and non-monotonic behavior may occur.

Figure 4:
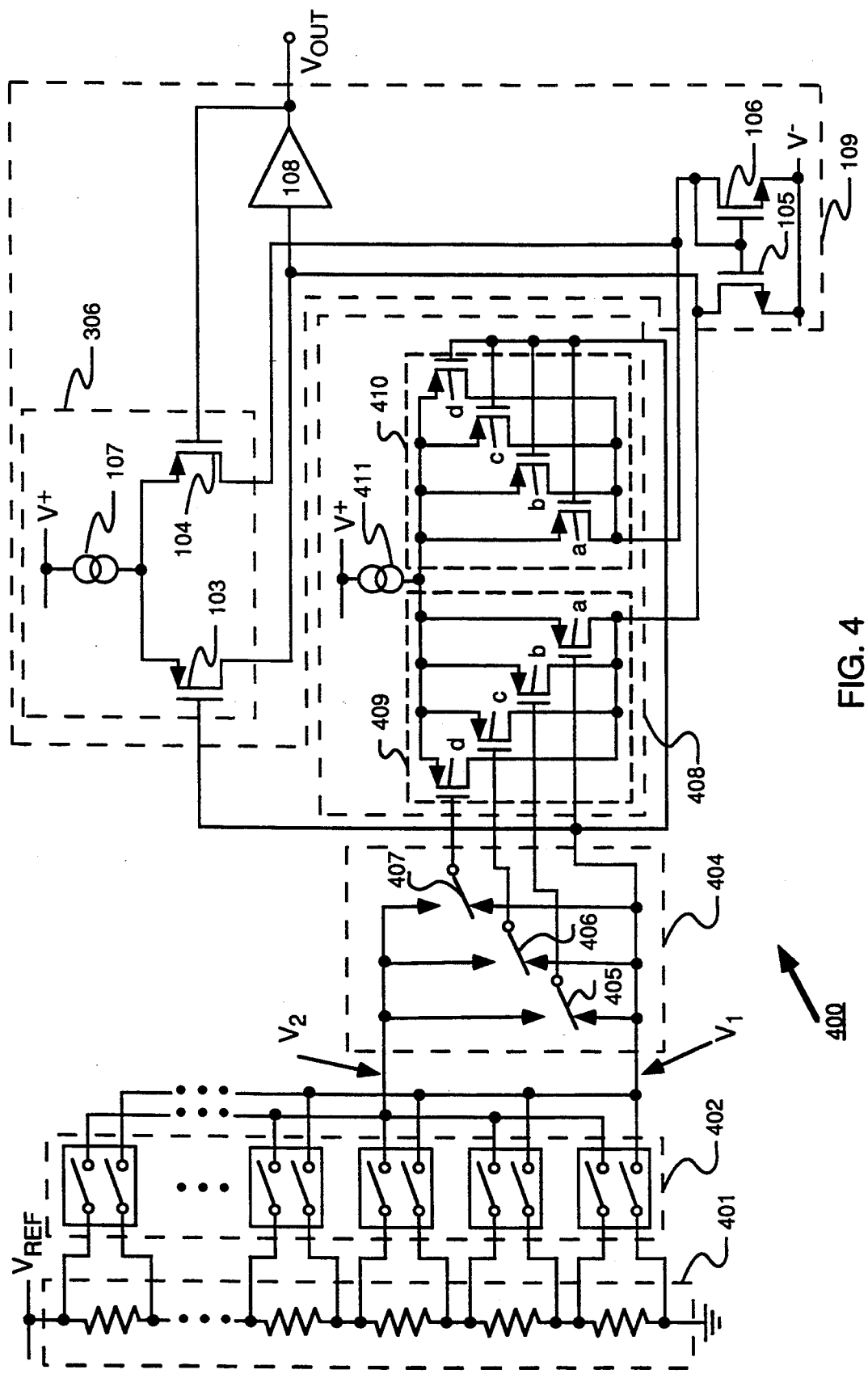
FIG. 4 is a block schematic diagram of an alternative embodiment of the present invention showing a segmented, interpolating DAC.

FIG. 4 illustrates a new digital to analog converter 400 which uses the principles of DAC 300 and solves the problem of sensitivity to ladder tap errors by truly interpolating the voltage between taps on a resistive element ladder; i.e., the range of the LSDTS is determined by the actual voltages of the taps that the LSDTS is attempting to span. FIG. 4 illustrates the particular case L=2, but DAC 400 can be implemented with any values for L and M.

DAC 400 does not derive the inputs to its two differential transconductance stages from two different parts of the resistive element ladder, and does not require the voltages across the resistive elements in the ladder to be uniform to ensure monotonicity. In addition, in DAC 400, transistors 302 and 303 are split into composite transistors 409 and 410 (and coupled to current source 411 to comprise LSDTS 408), each containing $2^L$ subtransistors, and the gate voltage of all subtransistors are allowed to differ by $V_{REF}/2^M$ at most. In FIG. 4, composite transistor 409 is shown to include four subtransistors 409 a–d, and composite transistor 410 is shown to include four subtransistors 410 a–d. Since these subtransistors all have substantially equal geometries, substantially equal drain currents, and similar gate voltages, their transconductances are all substantially the same.

Resistive element ladder 401 and switching device bank 402 are now arranged to provide two analog outputs rather than one. Switching device bank 402 is controlled by the MS digital subword to provide output voltages $V_1 = k_M V_{REF}/2^M$ and $V_2 = (k_M+1) V_{REF}/2^M$. Switching device bank 404 is controlled by the LS digital subword. Switching devices 405, 406, and 407 are shown in their normal positions corresponding to $k_L = 0$ in which they couple voltage $V_1$ to the gates of subtransistors 409b, 409c, and 409d respectively. If $k_L = 1$, switching device 405 is thrown to its alternative position; if $k_L = 2$, switching devices 405 and 406 are thrown to their alternative positions; and if $k_L = 3$, switching devices 405, 406, and 407 are all thrown to their alternative positions. In general, $k_L$ of the switching devices in switching device bank 404 are in their alternative positions, and $2^L - k_L$ are in their normal positions. In the alternative positions, switching devices 405, 406, and 407 couple voltage $V_2$ to the gates of subtransistors 409b, 409c, and 409d respectively.

As previously stated, if $k_L = 0$, switching devices 405, 406, and 407 are all in their normal positions. Thus, the gates of all subtransistors in LSDTS 408 are coupled to $V_1$, and the currents flowing out of the drains of these transistors are substantially equal. The LS subword in this case, therefore, does not influence the output voltage. The gate of transistor 103 is coupled to $V_1$, and negative feedback of the output to the gate of transistor 104 ensures that the output voltage is substantially equal to $V_1$, or $$V_{OUT} = k_M V_{REF}/2^M. \qquad (6)$$

If $k_L$ is not zero, the gates of $k_L$ subtransistors in composite transistor 409 are coupled to $V_2$ and $2^L - k_L$ gates are coupled to $V_1$. The gates of composite transistor 410 are also all coupled to $V_1$. In this manner, a scaled sum corresponding to $k_L$ is input to composite transistor 409 which causes LSDTS 408 to produce a modulated differential output current.

If the gates of all $2^L$ subtransistors of transistor 409 are supplied with the same small-signal voltage, LSDTS 408 will produce a certain differential output current. The ratio of output current to input voltage is $g_{mL}$, and this parameter is determined by the geometries of transistors 409 and 410, and by the value of current source 411. If the gate of any single subtransistor of composite transistor 409 is supplied with a small-signal voltage, and all other subtransistors are coupled to $V_1$, the ratio of output current to input voltage will be $g_{mL}/2^L$ (or $g_{mL}/4$ in the case shown in FIG. 4). Therefore, the differential output current of LSDTS 408 is $$dI = k_L g_{mL}(V_2 - V_1)/2^L.$$

Note that $V_2$-$V_1$ is the voltage across each resistive element in ladder 401 and is given by $V_{REF}/2^M$, so that $$dI = k_L g_{mL} V_{REF}/(2^M 2^L) = k_L g_{mL} V_{REF}/2^N. \qquad (7)$$

Due to the negative feedback, this differential current is balanced by an output voltage change dV given by $$dI = g_{mM} dV. \qquad (8)$$

Substituting equation (7) into equation (8) and solving for the change in output voltage gives $$dv = (g_{mL}/g_{mL}) k_L V_{REF}/2^N.$$

This change is added to the existing output voltage which is determined by the MS subword and is given in equation (6). The resulting output voltage is then $$V_{OUT} = k_M V_{REF}/2^M + (g_{mL}/g_{mM}) k_L V_{REF}/2^N. \qquad (9)$$

AS in DAC 300, the transconductance ratio $g_{mL}/g_{mM}$ in the equation above is a parameter which can be controlled. With $g_{mL}/g_{mM} = 1$, the output voltage, as defined by equation (9), becomes $$V_{OUT} = (2^L k_M + k_L) V_{REF}/2^N = k V_{REF}/2^N.$$

Thus, by choosing the transconductance ratio appropriately, the output voltage of DAC 400 can be made proportional to the decimal equivalent of the digital input word k.

The LS subword controls the amount of voltage added to the output voltage determined by the MS subword. If the transconductance ratio is chosen properly, the additional voltage contributed by the LS subword interpolates the output voltage such that it lies between $k_M V_{REF}/2^M$ and $(k_M+1) V_{REF}/2^M$.

LSDTS 408 can be implemented using various alternative designs in accordance with principles of the present invention. For example, composite transistor 410 could be replaced by a single transistor of equivalent geometry. Also, each composite transistor could include more or less than $2^L$ subtransistors, and the subtransistors might have different geometries relative to one another.

As mentioned previously, DAC 400 removes the sensitivity of the circuit to ladder tap errors, and it reduces the variation with common mode voltage of the transconductances of transistors in the differential transconductance stages. However, there is still a demand for the transconductance ratio $g_{mL}/g_{mM}$ to be accurately maintained. If the transconductance ratio is not accurately maintained, non-monotonic behavior may occur.

Figure 5:
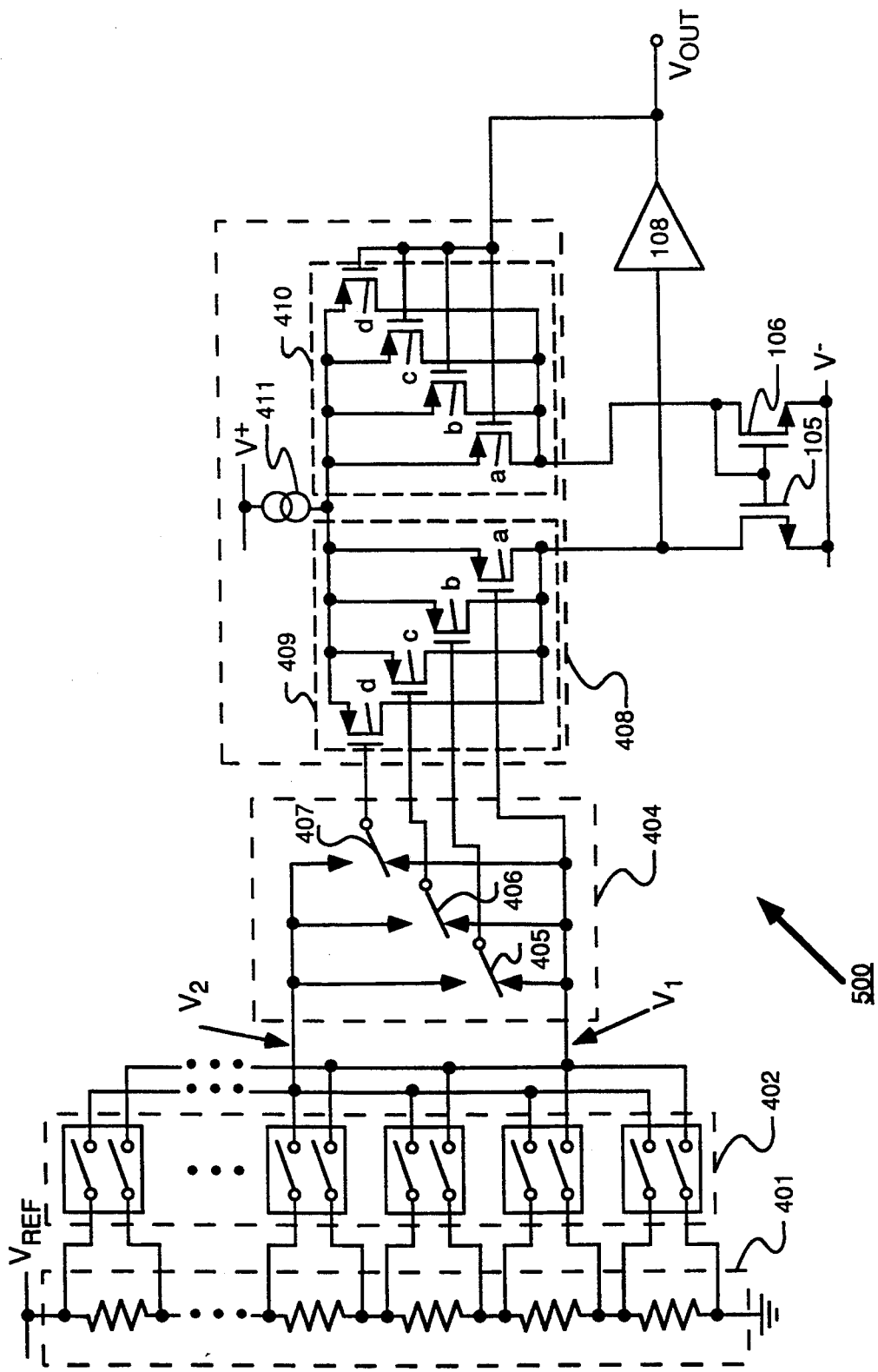
FIG. 5 is a block schematic diagram of a preferred embodiment of the present invention showing a segmented, interpolating DAC.

The requirement for an accurately determined transconductance ratio is removed in DAC 500 of FIG. 5 which illustrates the most preferred embodiment of the invention. This embodiment also maintains guaranteed monotonic behavior irrespective of ladder tap errors. FIG. 5 illustrates the case L=2. Obviously, this number is arbitrary, and DAC 500 can be implemented with any value of L and M.

DAC 500 makes use of the same resistive element ladder and switching device banks as DAC 400, and also uses the same composite transistors. However, DAC 500 does not have separate MS and LS differential transconductance stages. Instead DAC 500 has a single DTS which includes composite PMOS transistors 409 and 410. The sources of transistors 409 and 410 are fed by current source 411, and their drains (which respectively form first and second differential current outputs of transconductance stage 408) are coupled to the drains of NMOS transistors 105 and 106. Transistors 105 and 106 are connected in a current mirror configuration. The drain of transistor 105 is coupled to the input of high-gain inverting amplifier 108. The output of amplifier 108 is fed back to the gates of transistor 410, and supplies the output voltage $V_{out}$ of DAC 500.

As in DAC 400, switching device bank 402 is controlled by the MS digital subword so that $$V_1 = k_M V_{REF}/2^M \qquad (10)$$

and $$V_2 = (k_M + 1) V_{REF}/2^M. \qquad (11)$$

Switching device bank 404 is controlled by the LS digital subword so that $k_L$ switching devices are switched to their alternative positions and $2^L - k_L$ switching devices remain in their normal positions.

Differential pair 409–410 can be viewed as being made up of four sub differential pairs, 409a–410a, 409b–410b, 409c–410c, and 409d–410d. If the geometries of each of the sub pairs are equal, then all sub pairs will have substantially equal transconductances, and each sub pair will have a transconductance equal to $1/2^L$ times the transconductance of the composite differential pair 409-410.

Incrementing the LS subword by one causes switch bank 404 to switch one more gate of composite transistor 409 from $V_1$ to $V_2$. If the LS subword were zero, all gates of composite transistor 409 would be coupled to $V_1$, $V_{OUT}$ would be substantially equal to $V_1$, and because $V_1 = k_M V_{REF}/2^M$, $V_{OUT}$ would be substantially equal to $k_M V_{REF}/2^M$. Alternatively, if all gates of composite transistor 409 (including, for purposes of discussion, gate 409a) were to be coupled to $V_2$ then $V_{OUT}$ would be substantially equal to $V_2$, and because $V_2 = (k_M+1) V_{REF}/2^M$, $V_{OUT}$ would be substantially equal to $(k_M+1) V_{REF}/2^M$. Between these two extreme cases, if only one gate of composite transistor 409 is coupled to $V_2$ with the remaining $2^L - 1$ coupled to $V_1$, then $V_{OUT}$ will be substantially equal to $V_1$ plus $1/2^L$ times the difference between $V_1$ and $V_2$. That is, when the gate of one subtransistor is switched from $V_1$ to $V_2$, $V_{OUT}$ will move from $V_1$ towards $V_2$ by an amount of $(V_2 - V_1)/2^L$. Similarly, as each subsequent subtransistor gate is switched from $V_1$ to $V_2$, $V_{OUT}$ will move further towards $V_2$ by an amount of $(V_2 - V_1) 2^L$. If all subtransistor gates were to be switched to $V_2$, $V_{OUT}$ would equal $V_2$ (in the embodiment of FIG. 4, however, gate 409a does not switch to $V_2$). In general, $$V_{OUT} = V_1 + k_L (V_2 - V_1)/2^L. \qquad (12)$$

Incrementing the MS subword causes switch bank 402 to move $V_1$ and $V_2$ one tap up ladder 401. At the highest value of $k_L$, when all but one of the gates of transistor 409 are switched to $V_2$ (i.e. all but gate 409a), output voltage $V_{OUT}$ will be one increment below $V_2$, or $$V_{OUT}=V_1+(2^L-1)(V_2-V_1)/2^L=V_2-(V_2-V_1)/2^L.$$

The next higher step of the DAC output occurs when all switches of switch bank 404 return to tap $V_1$ and MS switches 402 move up one tap such that $V_1$ takes on the previous value of $V_2$ and $V_2$ moves one tap higher on the MS ladder. At this point, all gates of composite transistor 409 are switched to the new value of $V_1$ (the old value of $V_2$). $V_{OUT}$ then moves from its old value (one increment below the old value of $V_2$) to the new value of $V_1$ (which is now at the old value of $V_2$). Thus, as the LS subword resets and the MS subword increments, the output voltage moves up one increment of $(V_2-V_1)/2^L$, and monotonicity is assured.

Substituting equations (10) and (11) into (12), after some manipulation leads to $$V_{OUT} = (2^L k_M + k_L) V_{REF}/2^N$$
$$= k V_{REF}/2^N.$$

Thus, DAC 500 provides monotonic digital to analog conversion independently of ladder tap errors, without the need for accurate transconductance ratio control, and with a small number of resistive elements and switching devices.

Figure 6:
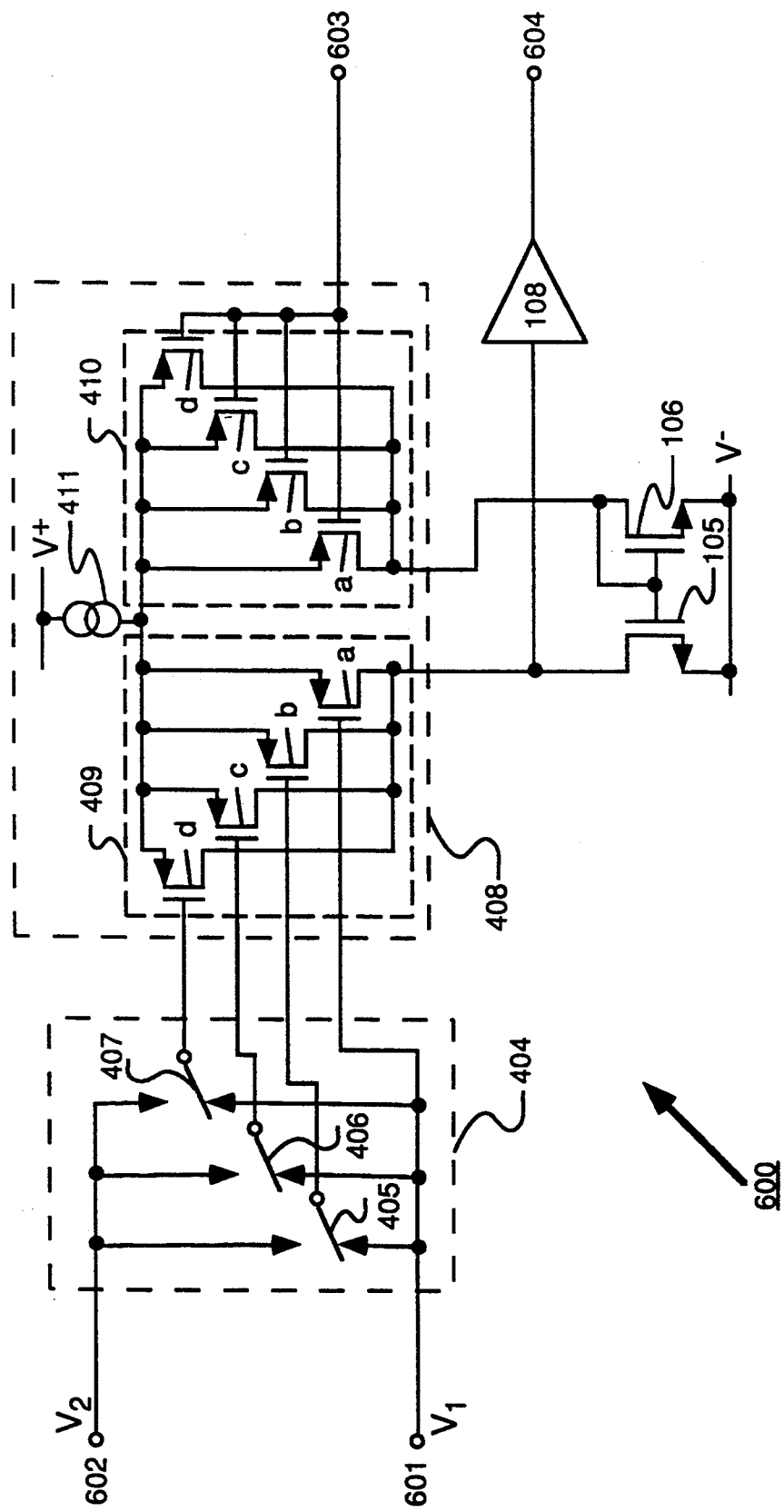
FIG. 6 is a schematic diagram of an embodiment of an interpolating differential amplifier input stage implemented in accordance with principles of the present invention.

FIG. 6 shows interpolating operational amplifier input stage 600 of the present invention, extracted from FIG. 5. This input stage may be used in applications other than digital to analog converters. Its utility arises from the fact that it can be used to provide an analog output $V_{OUT}$ at node 604 which can be digitally interpolated between two analog inputs, $V_1$ and $V_2$ at nodes 601 and 602. Circuit 600 can be generalized by coupling a feedback network from output node 604 to any of input nodes 601, 602, and 603. In addition, the gates of composite transistor 410 need not all be connected together as shown in FIG. 6.

The circuits of FIGS. 3 to 5 (especially DAC 300) could be used as digital to analog converters with internal trimming. In such an application, the LS subword could be replaced by control bits used to correct inaccuracies in the conversion of the MS subword. In this case, the LS subword does not add more resolution, but the inaccuracy of each MS tap is corrected by applying a unique digital correction word to the LS circuitry. The particular digital correction word is determined by the correction required for the tap selected by the MS word. The digital correction word can be stored in an internal memory device (not shown) at a location determined by the MS word. The memory device can then automatically couple the appropriate digital correction word to the LS circuitry.

Thus, circuits are provided for summing intermediate signals in a segmented DAC, and for converting a digital input word into an analog output voltage in such a way that the analog output voltage is a monotonic function of the digital input word, the circuit using a minimum number of switching devices and resistive elements. Although preferred embodiments of the circuit have been disclosed with various components connected to other components, one skilled in the art will appreciate that it may not be necessary for such connections to be direct and additional components may be interconnected between the shown connected components without departing from the spirit of the invention as shown. One skilled in the art will appreciate also that the present invention can be practiced by other than the described embodiments. For example, buffer 109 and the interpolating operational amplifier in FIG. 5 may be configured with feedback from its output to its negative input to have a gain other than unity, the circuit could be extended to have any number of LS or MS bits, switches in switch bank 404 can be incremented one at a time (thermometer code) or can be switched in binary combinations (1, 2, 4, 8, etc.), the circuit could be designed with bipolar transistors and, if desired, with bias current compensation to prevent loading of the resistive element ladders, rather than MOS transistors, and the circuit could be used in analog to digital converters. Any type of DAC which can generate two adjacent steps could be used in place of resistive element ladder 401 and switch bank 402 in either of FIG. 4 or FIG. 5. Further, the operational amplifier of FIG. 6 could be used in other applications, without a DAC, to interpolate between any two voltages. Also, the current mirror formed by transistors 105 and 106 and the inverting amplifier 108, which together form a differential current to single-ended output voltage conversion stage, could be replaced by substantially any other type of differential current to voltage converter used in conventional operational amplifier designs. The described embodiments are presented for purposes of illustration and not of limitation, and the present invention is limited only by the claims which follow.

The invention claimed is:

1. A circuit for converting a digital input signal to an analog output signal indicative of the value of the digital signal, the digital signal including a plurality of bits grouped into a first group of M more significant bits and a second group of L less significant bits, the circuit comprising:
   first and second signal generating means for converting the first and second bit groups into corresponding first and second quantized analog signals; and
   amplifier means coupled to the first and second signal generating means and to an analog output node for producing an analog output signal at the analog output node, the amplifier means including
   a first differential transconductance stage which generates a first differential current responsive to a difference between the first quantized analog signal and a feedback signal from the analog output node, wherein the first differential current causes the amplifier means to produce an analog output signal having a first component substantially proportional to the value of the first bit group, and
   a second differential transconductance stage which generates a second differential current responsive to a difference between the second quantized analog signal and a reference signal, the second differential current combining with the first differential current in the amplifier means to offset the analog output signal by a second component substantially proportional to the value of the second bit group.

2. The circuit defined in claim 1, wherein the first signal generating means comprises a ladder of resistive elements having a plurality of voltage taps coupled to a bank of switching devices for selecting one of the voltage taps to provide the first quantized analog signal.

3. The circuit defined in claim 2, wherein the second signal generating means comprises the ladder of resistive elements coupled to an additional bank of switching devices for selecting one of the voltage taps to provide the second quantized analog signal.

4. The circuit defined in claim 1, wherein the second signal generating means comprises a ladder of resistive elements having a plurality of voltage taps coupled to a bank of switching devices for selecting one of the voltage taps to provide the second quantized analog signal.

5. The circuit defined in claim 1, wherein the first and second differential transconductance stages have a transconductance ratio which scales the second component of the analog output signal relative to the first component.

6. A circuit for converting a digital input signal to an analog output signal at an analog output node indicative of the value of the digital signal, the digital signal including a plurality of bits grouped into a first group of M more significant bits and a second group of L less significant bits, the circuit comprising:
   a resistive ladder;
   a first switch bank coupled to the resistive ladder for converting the first bit group into a corresponding first quantized analog signal;
   a second switch bank coupled to the resistive ladder for converting the second bit group into a corresponding second quantized analog signal;
   a first differential transconductance stage having differential current outputs coupled to a differential current to voltage conversion stage which produces an analog output voltage at the analog output node, a first differential input coupled to the first switch bank and a second differential input coupled by a feedback path to the analog output node;
   a second differential transconductance stage having differential current outputs coupled to the differential current outputs of the first differential transconductance stage such that differential currents generated by the first and second transconductance stages are combined to produce an input signal for the differential current to voltage conversion stage, the second differential stage further having a first differential input coupled to the second switch bank, and a second differential input coupled to a reference potential.

7. The circuit defined in claim 6, wherein the differential current to voltage conversion stage comprises a current mirror and an inverting amplifier.

8. The circuit defined in claim 7, wherein the first and second differential transconductance stages respectively contribute first and second voltage components to the analog output signal, each of the first and second voltage components having a proportional relationship to the value of a respective one of the first and second bit groups, and wherein the proportional relationship of the second component to the value of the second bit group is determined at least in part by a ratio of transconductances of the first and second differential transconductance stages.

9. A circuit for converting a digital signal to an analog output signal, the digital signal including a plurality of bits grouped into a first group of M more significant bits and a second group of L less significant bits, the circuit comprising:
   first signal generating means for converting the first bit group into a first quantized analog signal corresponding to the value of the first bit group, the means for converting providing a monotonic conversion between the digital signal corresponding to the first bit group and the first quantized analog signal;
   second signal generating means for generating a second quantized analog signal corresponding to the value of the first bit group incremented by one bit, the means for generating providing a monotonic conversion between the digital signal corresponding to the first bit group plus one bit and the second quantized analog signal;
   amplifier means including a first differential transconductance means coupled to the first signal generating means for buffering the first quantized analog signal to provide an analog output signal having a first component corresponding to the first quantized analog signal;
   means coupled to the first and second signal generating means for producing a plurality of quantized control signals, each signal corresponding to one of the first and second quantized analog signals depending on the value of the second bit group such that the number of control signals corresponding to the second quantized analog signal is a monotonic function of the value of the second bit group; and
   second differential transconductance means coupled to the control signal producing means and to the amplifier means for modulating the analog output signal by adding a second component indicative of a scaled sum of the number of control signals corresponding to the second quantized analog signal.

10. The circuit defined in claim 9, wherein the first signal generating means comprises a ladder of resistive elements having a plurality of voltage taps coupled to a first bank of switching devices for selecting one of the voltage taps to provide the first quantized analog signal.

11. The circuit defined in claim 10 wherein the second signal generating means comprises the ladder of resistive elements coupled to a second bank of switching devices for selecting one of the voltage taps to provide the second quantized analog signal.

12. The circuit defined in claim 11, wherein the first bank of switching devices and the second bank of switching devices are commonly controlled by the digital signal corresponding to the first bit group.

13. The circuit defined in claim 12, wherein the control signal producing means comprises a third bank of switching devices which are controlled by the digital signal corresponding to the second bit group, the third bank of switching devices being coupled to switch between the first bank of switching devices and the second bank of switching devices, and to provide outputs to the second differential transconductance means.

14. The circuit defined in claim 9, wherein the first differential transconductance means has first and second differential signal inputs and corresponding first and second differential current outputs, and wherein the first quantized analog signal and a feedback signal derived from the analog output signal are coupled respectively to the first and second differential signal inputs of the first differential transconductance means and the first and second differential current outputs are coupled to a differential current to voltage conversion means.

15. The circuit defined in claim 14, wherein the amplifier means further comprises an inverting amplifier having an input and an output, the inverting amplifier input being coupled to a differential current output of the first differential transconductance means such that the inverting amplifier output provides the analog output signal.

16. The circuit defined in claim 9, wherein the control signal producing means comprises a bank of switching devices which are controlled by the digital signal corresponding to the second bit group, the bank of switching devices being coupled to switch between the first and second quantized analog signals and provide outputs to the second differential transconductance means.

17. The circuit defined in claim 9, wherein the second signal generating means comprises a ladder of resistive elements having a plurality of voltage taps coupled to a first bank of switching devices for selecting one of the voltage taps to provide the second quantized analog signal.

18. The circuit defined in claim 9, wherein the first and second differential transconductance means respectively produce first and second differential currents which are combined in the amplifier means.

19. The circuit defined in claim 18, wherein the second differential transconductance means comprises first and second transistors forming a differential pair of transistors, the first transistor comprising a composite transistor having a plurality of subtransistors and a plurality of inputs at least some of which are coupled to the control signal producing means, and wherein the second transistor has at least one input coupled to the first signal generating means.

20. The circuit defined in claim 19, wherein the first transistor comprises $2^L$ subtransistors.

21. The circuit defined in claim 19, wherein the first transistor consists of $2^L$ subtransistors.

22. The circuit defined in claim 19, wherein the first and second transistors are both composite transistors.

23. The circuit defined in claim 22, wherein each composite transistor comprises $2^L$ subtransistors.

24. The circuit defined in claim 22, wherein each composite transistor consists of $2^L$ subtransistors.

25. A circuit for converting a digital signal to an analog output signal at an analog output node, the digital signal including a plurality of bits grouped into a first group of M more significant bits and a second group of L less significant bits, the circuit comprising:
  a resistive ladder;
  a first set of switches coupled to the resistive ladder for providing a monotonic conversion between the digital signal corresponding to the first bit group and a first quantized analog signal;
  a second set of switches coupled to the resistive ladder for providing a monotonic conversion between the digital signal corresponding to the first bit group plus one and a second quantized analog signal;
  an amplifier including a first differential transconductance stage which generates a first differential current, the first differential transconductance stage having a first differential input coupled to the first set of switches for receiving the first quantized analog signal, a second differential input coupled to the analog output node by a feedback path, and corresponding first and second differential current outputs coupled to a differential current to voltage conversion stage which provides at the analog output node an analog output signal having a component indicative of the value of the first bit group;
  a third set of switches having a plurality of inputs each coupled to receive an input signal from one of the first quantized analog signal and the second quantized analog signal under control of the second bit group, and a plurality of outputs; and
  a second differential transconductance stage coupled to the amplifier which generates a second differential current that is combined with the first differential current in the amplifier to add an offset component to the analog output signal indicative of a scaled value of the second bit group, the second differential transconductance stage having a first plurality of inputs coupled to the plurality of outputs of the third set of switches and a second plurality of inputs coupled to the first set of switches, whereby the magnitude of the offset component is selected by the setting of the third set of switches.

26. The circuit defined in claim 25, wherein the first and second set of switches are controlled by the digital signal corresponding to the first bit group.

27. The circuit defined in claim 25, wherein the second differential transconductance stage comprises:
  a current source;
  a first composite transistor having a plurality of subtransistors, the first composite transistor having a plurality of inputs which correspond to the first plurality of inputs of the second differential transconductance stage; and
  a second composite transistor having a plurality of subtransistors, the second composite transistor having a plurality of inputs which correspond to the second plurality of inputs of the second differential transconductance stage, the first and second composite transistors being coupled between the current source and first and second differential current outputs of the second differential transconductance stage.

28. A circuit for converting a digital signal to an analog output signal at an analog output node, the digital signal including a plurality of bits grouped into a first group of M more significant bits and a second group of L less significant bits, the circuit comprising:
  first signal generating means for converting the first bit group into a first quantized analog signal corresponding to a value of the first bit group, the means for converting providing a monotonic conversion between the digital signal corresponding to the first bit group and the first quantized analog signal;
  second signal generating means for generating a second quantized analog signal corresponding to the value of the first bit group incremented by one bit, the means for generating providing a monotonic conversion between the digital signal corresponding to the first bit group plus one bit and the second quantized analog signal;
  means coupled to the first and second signal generating means for producing a plurality of quantized control signals, each signal corresponding to one of the first and second quantized analog signals depending on the value of the second bit group such that the number of control signals corresponding to the second quantized analog signal is a monotonic function of the value of the second bit group; and
  amplifier means coupled to the first signal generating means, the control signal producing means and the analog output node, for providing an analog output signal having a first component corresponding to the first quantized analog signal and a second component corresponding to a portion of the difference between the first and second quantized analog signals, the amplifier means including a differential transconductance stage having an offset voltage selected by the control signals produced by the control signal producing means to add the second component to the analog output signal, wherein the second component is indicative of a scaled sum of the number of control signals corresponding to the second quantized analog signal.

29. The circuit defined in claim 28, wherein the first signal generating means comprises a ladder of resistive elements having a plurality of voltage taps coupled to a first bank of switching devices for selecting one of the voltage taps to provide the first quantized analog signal.

30. The circuit defined in claim 29, wherein the second signal generating means comprises the ladder of resistive elements coupled to a second bank of switching devices for selecting one of the voltage taps to provide the second quantized analog signal.

31. The circuit defined in claim 30, wherein the first bank of switching devices and the second bank of switching devices are commonly controlled by the digital signal corresponding to the first bit group.

32. The circuit defined in claim 31, wherein the control signal producing means comprises a third bank of switching devices which are controlled by the digital signal corresponding to the second bit group, the third bank of switching devices being coupled to switch between the first bank of switching devices and the second bank of switching devices, and to provide outputs to the differential transconductance stage.

33. The circuit defined in claim 28, wherein the control signal producing means comprises a bank of switching devices which are controlled by the digital signal corresponding to the second bit group, the bank of switching devices being coupled to switch between the first and second quantized analog signals and provide outputs to the differential transconductance stage.

34. The circuit defined in claim 28, wherein the second signal generating means comprises a ladder of resistive elements having a plurality of voltage taps coupled to a first bank of switching devices for selecting one of the voltage taps to provide the second quantized analog signal.

35. The circuit defined in claim 28, wherein the differential transconductance stage comprises first and second transistors forming a differential pair of transistors, the first transistor comprising a composite transistor having a plurality of subtransistors.

36. The circuit defined in claim 35, wherein the first transistor comprises $2^L$ subtransistors.

37. The circuit defined in claim 35, wherein the first transistor consists of $2^L$ subtransistors.

38. The circuit defined in claim 28, wherein the first and second transistors are both composite transistors.

39. The circuit defined in claim 38, wherein each composite transistor comprises $2^L$ subtransistors.

40. The circuit defined in claim 38, wherein each composite transistor consists of $2^L$ subtransistors.

41. The circuit defined in claim 28, wherein the differential transconductance stage comprises first and second composite transistors each having a plurality of subtransistors, and wherein one subtransistor of the first composite transistor has an unswitched input coupled to receive the first quantized analog signal from the first signal generating means, the remainder of the subtransistors of the first composite transistor have switched inputs coupled to the control signal producing means, and the subtransistors of the second composite transistor have inputs coupled to receive a feedback signal from the analog output node.

42. A circuit for converting a digital signal to an analog output signal, the digital signal including a plurality of bits grouped into a first group of M more significant bits and a second group of L less significant bits, the circuit comprising:
a resistive ladder;
a first set of switches coupled to the resistive ladder for providing a monotonic conversion between the digital signal corresponding to the first bit group and a first quantized analog signal;
a second set of switches coupled to the resistive ladder for providing a monotonic conversion between the digital signal corresponding to the first bit group plus one and a second quantized analog signal;
a third set of switches having a plurality of inputs coupled to receive an input signal from either the first quantized analog signal or the second quantized analog signal, and a plurality of outputs; and
a differential amplifier having an output, a first plurality of differential inputs coupled to the plurality of outputs of the third set of switches and a second plurality of differential inputs coupled by a feedback path to the output, the differential amplifier generating an analog output signal at its output having a value between minimum and maximum thresholds established respectively by the first and second quantized analog signals, the value being selected by signals received by the differential amplifier from the third set of switches.

43. The circuit defined in claim 42, wherein the differential amplifier includes an inverting amplifier.

44. The circuit defined in claim 43, wherein the differential amplifier includes a differential transconductance stage comprising:
a current source;
a first composite transistor having a plurality of subtransistors, the first composite transistor having a plurality of inputs which correspond to the first plurality of inputs of the differential amplifier; and
a second composite transistor having a plurality of subtransistors, the second composite transistor having a plurality of inputs which correspond to the second plurality of inputs of the differential amplifier, the first and second composite transistors being coupled between the current source and differential current outputs of the differential transconductance stage.

45. The circuit defined in claim 44, wherein the differential current outputs of the differential transconductance stage are coupled to a differential current to voltage converter such that signal outputs of the first and second composite transistors remain substantially equal.

46. The circuit defined in claim 42, wherein the first and second set of switches are commonly controlled by the digital signal corresponding to the first bit group.

47. The circuit defined in claim 46, wherein the third set of switches are controlled by the digital signal corresponding to the second bit group.

48. An operational amplifier circuit which interpolates between first and second analog input signals based on an L-bit digital signal having a minimum value and a maximum value, the operational amplifier comprising:
a differential stage having a composite input device with at least one input coupled to receive the first analog input signal and at least L control inputs, the differential stage producing an analog output signal having a first component indicative of the first analog input signal; and at least L switching devices coupled to the control inputs for modulating an offset parameter of the differential stage responsive to the L-bit digital signal, whereby a second component is added to the analog output signal, the value of the second component being a monotonic function of the value of the L-bit digital word such that the analog output signal corresponding to the minimum value of the L-bit digital word is substantially indicative of the first analog input signal and the analog output signal corresponding to the maximum value of the L-bit digital word is substantially indicative of the second analog input signal.

49. The interpolating amplifier circuit defined in claim 48, wherein the differential stage further comprises a second composite device having a plurality of inputs coupled together to form a feedback node.

50. A digitally trimmed circuit for converting an M-bit digital input signal to an analog output signal, the circuit comprising:

means for converting the M-bit digital input signal into a corresponding first quantized analog signal;

means for generating a second quantized analog signal from an L-bit digital correction signal;

means for buffering the first quantized analog signal to provide an analog output signal having a component corresponding to the first quantized analog signal; and means responsive to the second quantized analog signal for modulating the buffering means to add to the analog output signal a component indicative of a scaled value of the second quantized analog signal.

51. The circuit defined in claim 50, wherein the means for converting comprises a resistive ladder having a plurality of voltage taps coupled to a first bank of switching devices for selecting one of the voltage taps as the first quantized analog signal.

52. The circuit defined in claim 51, wherein the means for generating comprises a second bank of switching devices which are controlled by the L-bit digital correction signal, the second bank of switching devices being coupled between the resistive ladder and the means responsive to the second quantized analog signal.

53. The circuit defined in claim 50, wherein the L-bit digital correction signal is stored in a memory at a location determined by the M-bit digital input signal.

54. A digitally trimmed circuit for converting an M-bit digital input signal to an analog output signal, the circuit comprising:

a resistive ladder;

a first bank of switching devices coupled to the resistive ladder for converting the M-bit digital signal into a first quantized analog signal;

a second bank of switching devices coupled to the resistive ladder for converting an L-bit digital correction signal into a second quantized analog signal;

a first differential amplifier stage for providing the analog output signal such that the analog output signal has a component corresponding to the first quantized analog signal, said first differential amplifier stage including a differential current to voltage converter circuit having a voltage output coupled to an input of said first differential amplifier stage to provide a feedback signal to said first differential amplifier stage;

a second differential amplifier stage for modulating the analog output signal to add to the analog output signal a component indicative of a scaled value of the second quantized analog signal such that the analog output signal accurately represents the M-bit digital input signal.

55. The circuit defined in claim 54, wherein the first and second differential amplifier stages are commonly coupled to the differential current to voltage converter circuit.

56. The circuit defined in claim 54, wherein the L-bit digital correction signal is stored in a memory at a location determined by the M-bit digital input signal.

* * * * *

UNITED STATES PATENT AND TRADEMARK OFFICE
CERTIFICATE OF CORRECTION

PATENT NO. : 5,396,245
DATED : March 7, 1995
INVENTOR(S) : William C. Rempfer

It is certified that error appears in the above-identified patent and that said Letters Patent is hereby corrected as shown below:

Cover page
References Cited
5th reference cited    Change "341/101" to -- 341/161 --.

| Column | | line | | | |
|---|---|---|---|---|---|
| | 2 | 59 | Insert | -- of -- after "embodiment". |
| | 3 | 52 | Change | "can this" to -- this can --. |
| | 3 | 67-68 | Change | "$VEF_{RE}/2^N$" to -- $V_{REF}/2^N$ --. |
| | 6 | 67 | Insert | -- than -- after "higher". |
| | 7 | 55 | Change | "$2^L$" to -- $2^{-L}$ --. |
| | 8 | 13 | Change | "voltage" to -- voltages --. |
| | 9 | 21 | Change | "$(g_{mL}/g_{mL})$" to -- $(g_{mL}/g_{mM})$ --. |
| | 10 | 60 | Insert | -- / -- after "$(V_2-V_1)$". |

Signed and Sealed this

Thirty-first Day of August, 1999

Attest:

Q. TODD DICKINSON

*Attesting Officer*     *Acting Commissioner of Patents and Trademarks*